(12) United States Patent
Wen et al.

(10) Patent No.: US 10,868,003 B2
(45) Date of Patent: Dec. 15, 2020

(54) CREATING DEVICES WITH MULTIPLE THRESHOLD VOLTAGES BY CUT-METAL-GATE PROCESS

(71) Applicant: Taiwan Semiconductor Manufacturing Co., Ltd., Hsinchu (TW)

(72) Inventors: Ming-Chang Wen, Kaohsiung (TW); Chang-Yun Chang, Taipei (TW); Hsien-Chin Lin, Hsinchu (TW); Bone-Fong Wu, Hsinchu (TW); Ya-Hsiu Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/663,858

(22) Filed: Oct. 25, 2019

(65) Prior Publication Data

US 2020/0058650 A1    Feb. 20, 2020

Related U.S. Application Data

(62) Division of application No. 15/904,585, filed on Feb. 26, 2018, now Pat. No. 10,461,078.

(51) Int. Cl.
*H01L 27/088*    (2006.01)
*H01L 27/02*    (2006.01)
(Continued)

(52) U.S. Cl.
CPC ...... *H01L 27/0886* (2013.01); *H01L 21/0274* (2013.01); *H01L 21/28079* (2013.01);
(Continued)

(58) Field of Classification Search
None
See application file for complete search history.

(56) References Cited

U.S. PATENT DOCUMENTS 5,143,866 A    9/1992 Matsutani
5,628,919 A    5/1997 Tomura et al.
(Continued)

FOREIGN PATENT DOCUMENTS

CN    103177950    6/2013
EP    0023429    12/1985
TW    201735133    10/2017

OTHER PUBLICATIONS

Hsu, Kuo-Hsiu et al., "SRAM Cell with Balanced Write Port", U.S. Appl. No. 15/625,490, filed Jun. 16, 2017, 41 pages.
(Continued)

*Primary Examiner* — Bilkis Jahan
(74) *Attorney, Agent, or Firm* — Haynes and Boone, LLP (57) ABSTRACT

A semiconductor device includes first and second transistors each having a high-k metal gate disposed over a respective channel region of the transistors. The semiconductor device further includes first and second dielectric features in physical contact with an end of the respective high-k metal gates. The first and second transistors are of a same conductivity type. The two high-k metal gates have a same number of material layers. The first transistor's threshold voltage is different from the second transistor's threshold voltage, and at least one of following is true: the two high-k metal gates have different widths, the first and second dielectric features have different distances from respective channel regions of the two transistors, and the first and second dielectric features have different dimensions.

20 Claims, 10 Drawing Sheets

(51) Int. Cl.
- *H01L 29/49* (2006.01)
- *H01L 21/8234* (2006.01)
- *H01L 29/06* (2006.01)
- *H01L 21/3213* (2006.01)
- *H01L 29/66* (2006.01)
- *H01L 21/027* (2006.01)
- *H01L 21/28* (2006.01)
- *H01L 29/423* (2006.01)

(52) U.S. Cl.
CPC .. *H01L 21/28088* (2013.01); *H01L 21/32135* (2013.01); *H01L 21/82345* (2013.01); *H01L 21/823431* (2013.01); *H01L 21/823437* (2013.01); *H01L 21/823462* (2013.01); *H01L 27/0207* (2013.01); *H01L 29/0649* (2013.01); *H01L 29/42372* (2013.01); *H01L 29/4958* (2013.01); *H01L 29/4966* (2013.01); *H01L 29/66545* (2013.01); *H01L 21/32139* (2013.01); *H01L 21/823481* (2013.01); *H01L 29/6656* (2013.01)

(56) References Cited

U.S. PATENT DOCUMENTS

| | | | |
|---|---|---|---|
| 8,772,109 | B2 | 7/2014 | Colinge |
| 8,785,285 | B2 | 7/2014 | Tsai et al. |
| 8,816,444 | B2 | 8/2014 | Wann et al. |
| 8,823,065 | B2 | 9/2014 | Wang et al. |
| 8,860,148 | B2 * | 10/2014 | Hu .................... H01L 27/0629 257/401 |
| 8,941,214 | B2 | 1/2015 | Sell |
| 8,980,763 | B2 | 3/2015 | Wang et al. |
| 9,105,490 | B2 | 8/2015 | Wang et al. |
| 9,236,267 | B2 | 1/2016 | De et al. |
| 9,236,300 | B2 | 1/2016 | Liaw |
| 9,324,866 | B2 | 4/2016 | Yu et al. |
| 9,425,391 | B1 | 8/2016 | Lai et al. |
| 9,520,482 | B1 | 12/2016 | Chang et al. |
| 9,576,814 | B2 | 2/2017 | Wu et al. |
| 9,590,089 | B2 | 3/2017 | Rachmady et al. |
| 9,728,462 | B2 | 8/2017 | Fan et al. |
| 9,837,406 | B1 | 12/2017 | Balakrishnan et al. |
| 10,050,045 | B1 | 8/2018 | Hsu et al. |
| 10,319,581 | B1 * | 6/2019 | Wen ................ H01L 21/02164 |
| 10,373,877 | B1 * | 8/2019 | Wang ............... H01L 21/76224 |
| 2015/0145065 | A1 * | 5/2015 | Kanakasabapathy ........................ H01L 21/82348 257/401 |
| 2016/0172435 | A1 | 6/2016 | Pai et al. |
| 2016/0308045 | A1 | 10/2016 | Moens et al. |
| 2017/0148914 | A1 * | 5/2017 | Lee ................. H01L 29/66545 |
| 2018/0145077 | A1 * | 5/2018 | Dewey ............... H01L 29/205 |
| 2018/0308952 | A1 * | 10/2018 | Adusumilli .......... H01L 29/785 |
| 2019/0103472 | A1 | 4/2019 | Cheng et al. |
| 2019/0139771 | A1 * | 5/2019 | Kang ............... H01L 29/66818 |
| 2019/0157159 | A1 | 5/2019 | Wen et al. |
| 2019/0267372 | A1 | 8/2019 | Wen et al. |

OTHER PUBLICATIONS

Cheng, Chao-Ching et al., "Gate Stacks for Stack-Fin Channel I/O Devices and Nanowire Channel Core Devices", U.S. Appl. No. 15/719,686, filed Sep. 29, 2017, 65 pages.

Ming-Chang Wen et al., "Etch Stop Layer Between Substrate and Isolation Structure", U.S. Appl. No. 15/816,155, filed Nov. 17, 2017, 32 pages.

Ming-Chang Wen et al., "Cut Metal Gate Process for Reducing Transistor Spacing", U.S. Appl. No. 15/827,709, filed Nov. 30, 2017, 47 pages.

* cited by examiner

CREATING DEVICES WITH MULTIPLE THRESHOLD VOLTAGES BY CUT-METAL-GATE PROCESS

PRIORITY DATA

This is a divisional application of U.S. patent application Ser. No. 15/904,585, filed Feb. 26, 2018, entitled "CREATING DEVICES WITH MULTIPLE THRESHOLD VOLTAGES BY CUT-METAL-GATE PROCESS," the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, high-k metal gates have been implemented in an effort to reduce gate leakage current, poly-silicon gate depletion, as well as other issues associated with the continued down-scaling. Transistor threshold voltage (Vt) tuning typically relies on stacking various metal layers in the high-k metal gates and then patterning the metal layers to achieve different threshold voltages. With such an approach, the number of available threshold voltages is limited by the number of metal layers that can be reliably deposited and patterned. As the scaling-down continues, such Vt tuning approach has become more difficult to implement, and typical CMOS (complementary metal-oxide semiconductor) processes can only provide four to six different threshold voltages for circuit designers. How to provide more tunable threshold voltages in today's ever-smaller devices remains a challenge.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and fabrication methods, and more particularly to fabricating FinFET devices using a cut metal gate process. A cut metal gate process refers to a fabrication process where after metal gates (e.g., high-k metal gates or HK MG) replace dummy gate structure (e.g., polysilicon gates), the metal gates are cut by one or more etching processes to separate each of them into multiple portions. Each portion functions as a metal gate for an individual FinFET transistor. The inventors of the present disclosure have discovered that by properly designing the cut metal gate processes, one can tune the threshold voltages (Vt) of the resultant transistors, in addition to tuning the Vt with different metal layers. This advantageously increases the number of Vt choices for circuit designers, enabling a more variety of circuits to be implemented. Particularly, the cut metal gate processes according to the present disclosure can produce adjacent transistors with different threshold voltages, which might be difficult to implement using existing approaches given the proximity of the transistors and the need for different metal patterning with the existing approaches.

Figure 1A:
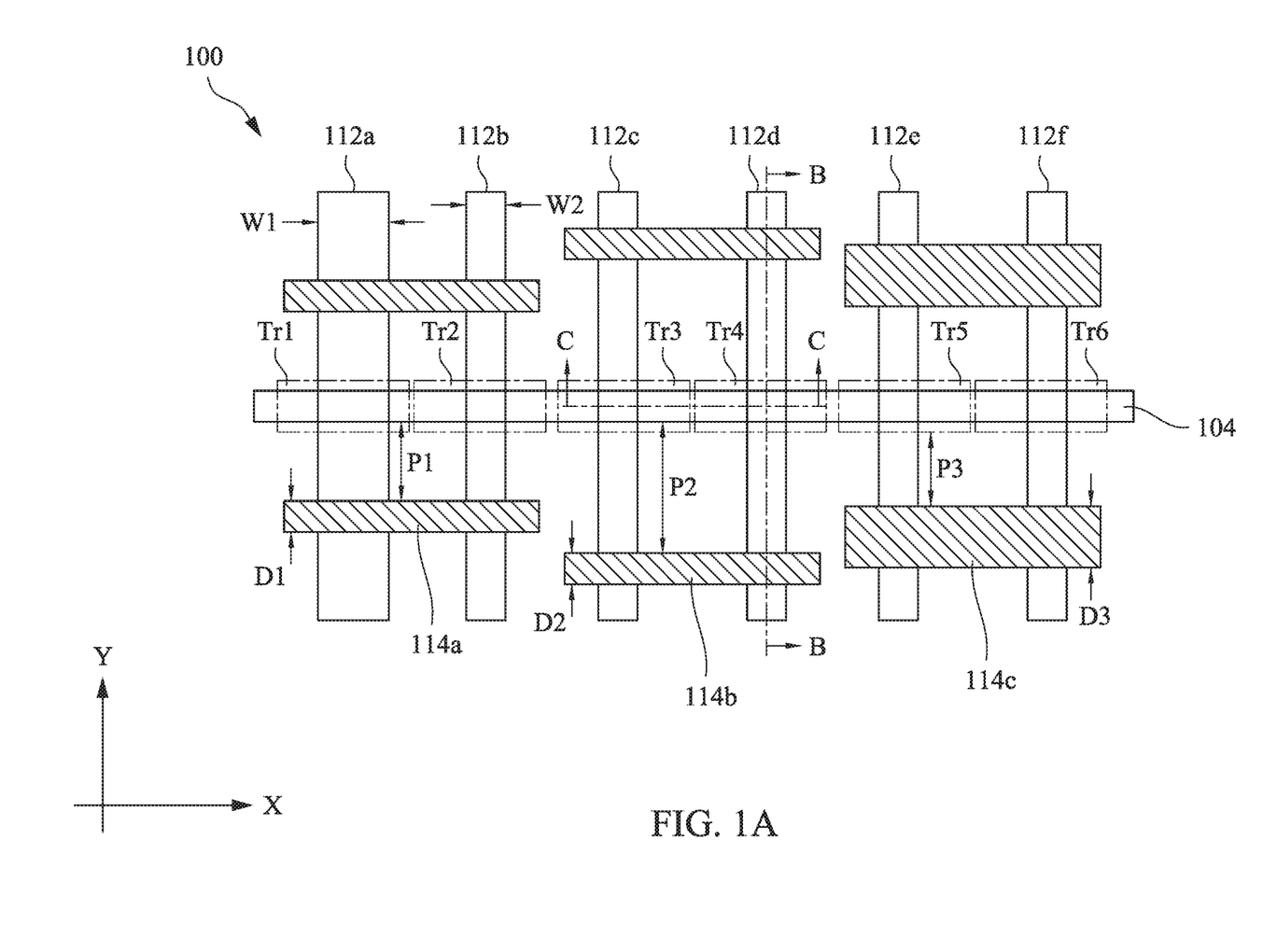
FIG. 1A shows a top view of a semiconductor structure implemented with a cut metal gate process, according to aspects of the present disclosure.
Figure 1B:
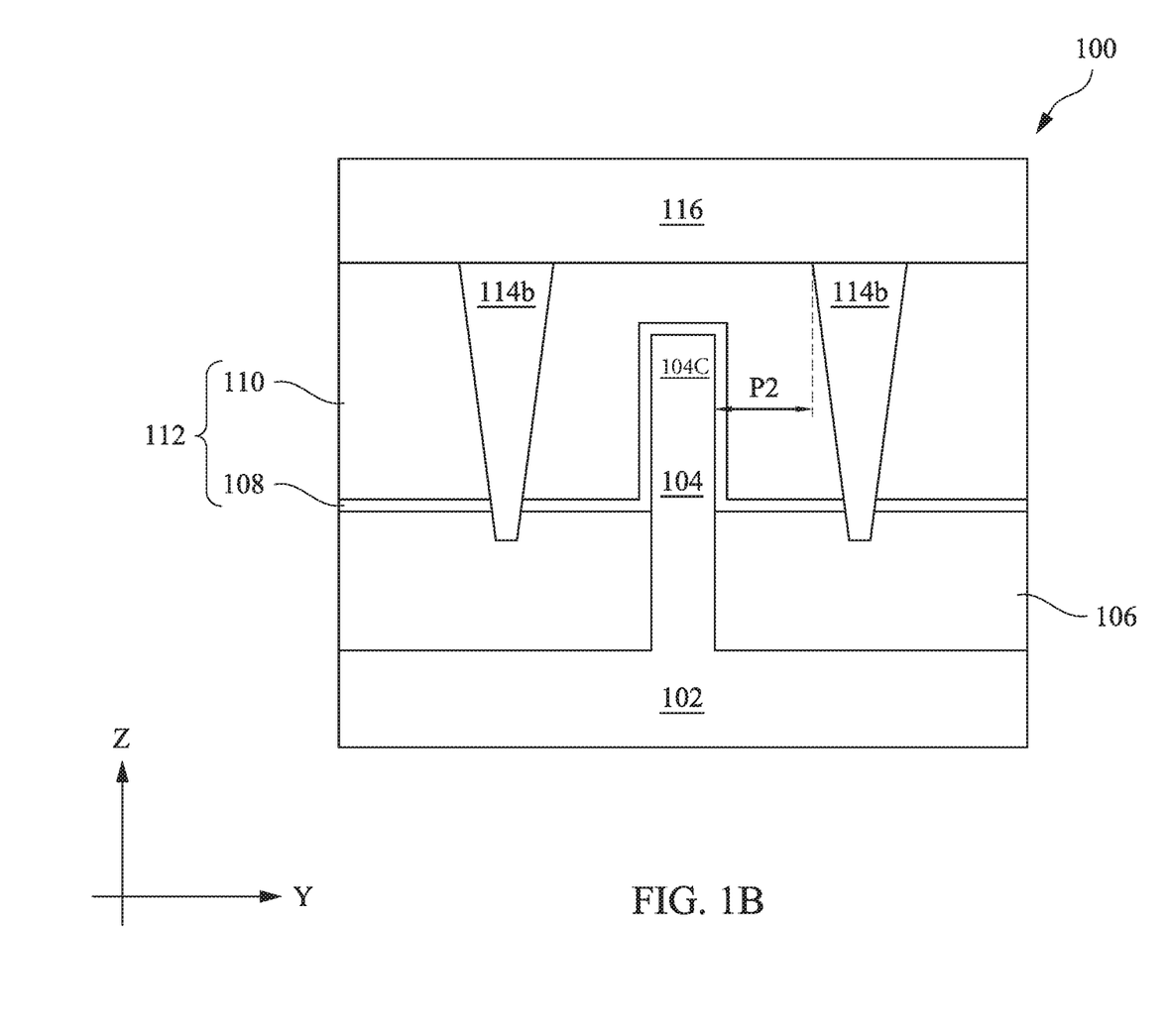
FIG. 1B shows a cross-sectional view of the semiconductor structure in FIG. 1A, in accordance with an embodiment.

FIG. 1A illustrates a top view of a semiconductor device (or semiconductor structure) 100. FIG. 1B illustrates a cross-sectional view of the device 100 along the B-B line of FIG. 1A. Referring to FIGS. and 1B collectively, the device 100 includes a substrate 102, a plurality of fins 104 (one shown) protruding out of the substrate 102, an isolation structure 106 over the substrate 102 and between the fins 104, and a plurality of gate stacks (or gate structures) 112 (including 112a, 112b, 112c, 112d, 112e, and 112f) disposed over the fins 104 and the isolation structure 106. Each gate stack 112 includes a high-k dielectric layer 108 and a gate electrode layer 110. The high-k dielectric layer 108 is disposed over sidewalls of the channel region 104C of the fin 104, and the gate electrode layer 110 is disposed over the high-k dielectric layer 108. The gate electrode layer 110 includes one or more layers of metallic materials. Therefore, each gate stack 112 is also referred to as a high-k metal gate (or HK MG) 112. The gate stacks 112 may further include an interfacial layer (not shown) under the high-k dielectric layer 108. The interfacial layer may include a dielectric material such as silicon oxide ($SiO_2$) or silicon oxynitride (SiON), and may be formed by chemical oxidation, thermal oxidation, atomic layer deposition (ALD), chemical vapor deposition (CVD), and/or other suitable methods. The gate electrode layer 110 may include a capping layer, a barrier layer, a work function metal layer, a metal fill layer, and/or other suitable layers. The device 100 further includes a dielectric layer 114, including dielectric features 114a, 114b, and 114c. The device 100 further includes one or more dielectric layers 116 disposed over the gate stacks 112 and the dielectric layer 114. The device 100 further includes source/drain features (not shown in FIG. 1A, but in FIG. 3 to be described later) disposed over the fins 104.

From the top view (FIG. 1A), the fins 104 are arranged lengthwise along the X direction, and the gate stacks 112 are arranged lengthwise along the Y direction which is generally perpendicular to the X direction. The gate stacks 112 are generally parallel to each other. The gate stacks 112 may have the same width or different widths along the X direction. In the example shown in FIG. 1A, the width W1 of the gate stack 112a is greater than the width W2 of the gate stack 112b, while the gate stacks 112b-f have the same width W2. The dielectric features 114a-c are arranged lengthwise along the X direction and separate each piece of the gate stacks 112 into multiple portions. Each portion of the gate stacks 112 engages a respective channel region (104C in FIG. 1B) of the fin 104 to form individual FinFET transistors. In the example shown in FIG. 1A, there are six individual FinFET transistors at the intersections of the gate stacks 112 and the fin 104, namely Tr1, Tr2, Tr3, Tr4, Tr5, and Tr6.

In the present embodiment, the distance (or proximity) between a dielectric feature 114 and the fin 104 is taken from one edge of the fin 104 to the nearest edge of the dielectric feature 114 along the lengthwise direction of the gate stack 112 (the Y direction in the present embodiment). Alternatively, the distance can also be taken from the center line of the fin 104 to the center line of the dielectric feature 114 along the lengthwise direction of the respective gate stack 112. In the embodiment shown in FIG. 1A, the dielectric feature 114a is disposed at a distance P1 from the fin 104, the dielectric feature 114b is disposed at a distance P2 from the fin 104, and the dielectric feature 114c is disposed at a distance P3 from the fin 104. The distances P1, P2, and P3 may be the same or different in various embodiments. In the example shown in FIG. 1A, P3 is equal to P1 and is less than P2. Further, along the Y direction, the dielectric feature 114a has a dimension D1, the dielectric feature 114b has a dimension D2, and the dielectric feature 114a has a dimension D3. The dimensions D1, D2, and D3 may be the same or different in various embodiments. In the example shown in FIG. 1A, D1 is the same as D2 and is smaller than D3.

The six transistors Tr1-6 may be tuned to have various threshold voltages in the present embodiment, for example, by placing the dielectric features 114a-c at different distances from the fin 104, and/or by forming the dielectric features 114a-c to have different dimensions along the Y direction. This aspect will be further described below.

It is noted that the device 100 shown in FIG. 1A is merely an example. In various examples, the device 100 may include any number of fins 104, any number of gate stacks 112, and any number of dielectric features 114. Further, the distances between the dielectric features 114 and the fins 104, the dimensions of the dielectric features 114, the widths of the gate stacks 112, and the composition of the gate electrode 110 can be designed and adjusted to achieve different circuit performance, such as providing appropriate threshold voltages for the respective transistors. Still further, even though described using FinFETs as examples, the inventive concepts of the present disclosure can be similarly applied to planar transistors as well as other multi-gate transistors.

The components of the device 100 are further described below. The substrate 102 is a silicon substrate (e.g., a silicon wafer) in the present embodiment. Alternatively, the substrate 102 may comprise another elementary semiconductor, such as germanium; a compound semiconductor including silicon carbide, gallium nitride, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof. In embodiments, the substrate 102 may include indium tin oxide (ITO) glass, include silicon on insulator (SOI) substrate, be strained and/or stressed for performance enhancement, include epitaxial regions, doped regions, and/or include other suitable features and layers.

The fins 104 may include one or more layers of semiconductor materials such as silicon or silicon germanium. In an embodiment, the fins 104 include multiple layers of semiconductor materials alternately stacked one over the other, for example, having multiple layers of silicon and multiple layers of silicon germanium alternately stacked. The fins 104 may be patterned by any suitable method. For example, the fins 104 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used as a masking element for patterning the fins 104. For example, the masking element may be used for etching recesses into semiconductor layers over or in the substrate 102, leaving the fins 104 on the substrate 102. The etching process may include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant. Numerous other embodiments of methods to form the fins 104 may be suitable.

The isolation structure 106 may include silicon oxide ($SiO_2$), silicon nitride ($Si_3N_4$), silicon oxynitride (SiON), fluoride-doped silicate glass (FSG), a low-k dielectric material, and/or other suitable insulating material. In an embodiment, the isolation structure 106 is formed by etching trenches in or over the substrate 102 (e.g., as part of the process of forming the fins 104), filling the trenches with an insulating material, and performing a chemical mechanical planarization (CMP) process and/or an etching back process to the insulating material, leaving the remaining insulating material as the isolation structure 106. Other types of isolation structure may also be suitable, such as field oxide and LOCal Oxidation of Silicon (LOCOS). The isolation structure 106 may include a multi-layer structure, for example, having one or more liner layers on surfaces of the substrate 102 and the fins 104 and a main isolating layer over the one or more liner layers.

The high-k dielectric layer 108 may include one or more high-k dielectric materials (or one or more layers of high-k dielectric materials), such as hafnium silicon oxide (HfSiO), hafnium oxide ($HfO_2$), alumina ($Al_2O_3$), zirconium oxide ($ZrO_2$), lanthanum oxide ($La_2O_3$), titanium oxide ($TiO_2$), yttrium oxide ($Y_2O_3$), strontium titanate ($SrTiO_3$), or a combination thereof. The high-k dielectric layer 108 may be deposited using CVD, physical vapor deposition (PVD), ALD, and/or other suitable methods.

The gate electrode 110 includes one or more metal layers, such as work function metal layer(s), conductive barrier layer(s), and metal fill layer(s). The work function metal layer may be a p-type or an n-type work function layer depending on the type (PFET or NFET) of the device. The p-type work function layer comprises a metal selected from but not restricted to the group of titanium aluminum nitride (TiAlN), titanium nitride (TiN), tantalum nitride (TaN), ruthenium (Ru), molybdenum (Mo), tungsten (W), platinum (Pt), or combinations thereof. The n-type work function layer comprises a metal selected from but not restricted to the group of titanium (Ti), aluminum (Al), tantalum carbide (TaC), tantalum carbide nitride (TaCN), tantalum silicon nitride (TaSiN), titanium aluminum nitride (TiAlN), titanium silicon nitride (TiSiN), or combinations thereof. The metal fill layer may include aluminum (Al), tungsten (W), cobalt (Co), and/or other suitable materials. The gate electrode layer 110 may be deposited using methods such as CVD, PVD, plating, and/or other suitable processes. The gate stacks 112 may be formed by any suitable processes including gate-first processes and gate-last processes. In a gate-first process, various material layers are deposited and patterned to become the gate stacks 112 before transistor source/drain features are formed. In a gate-last process (also termed as a gate replacement process), temporary gate structures are formed first. Then, after transistor source/drain features are formed, the temporary gate structures are removed and replaced with the gate stacks 112.

In the present embodiment, after the gate stacks 112 are deposited, they are etched by one or more etching processes to form trenches into the device 100 (e.g., operation 206 of FIG. 2A to be described later). The trenches are subsequently filled with the dielectric layer 114 (e.g., operation 208 of FIG. 2A to be described later). In a further embodiment, the one or more etching processes use an etchant that contains oxygen, chlorine, or fluorine elements. For example, the etchant may have a gas mixture of $Cl_2$, $O_2$, a carbon-and-fluorine containing gas, a bromine-and-fluorine containing gas, and a carbon-hydrogen-and-fluorine containing gas. In one particular example, the etchant includes a gas mixture of $Cl_2$, $O_2$, $CF_4$, $BCl_3$, and $CHF_3$. Such etchant not only removes the target portions of the gate stacks 112, but also alters the composition of the gate electrode 110 in the remaining portions of the gate stacks 112. For example, when the gate electrode 110 includes aluminum, such etchant has an effect of reducing the amount of aluminum in the gate electrode 110.

The inventors of the present disclosure have discovered that the effects of such etchant upon the gate electrode 110 (e.g., the amount of aluminum reduction in the gate electrode 110) are affected by multiple factors, including the proximity of the etching to the fins 104 (e.g., the distances P1, P2, and P3), the width of the affected gate stacks 112 (e.g., the widths W1 and W2), and the size of the etched trenches (e.g., the dimensions D1, D2, and D3).

For example, with everything else being the same, when the proximity of the etching to the fin 104 is smaller, the etchant exerts stronger effects on the gate electrode 110. For example, it causes greater amount of aluminum reduction in the gate electrode 110. This is the scenario for the gate stacks 112b and 112c which have the same width and the same composition (number of layers, materials of each layer, and configuration of the layers) in their respective gate electrodes 110 before the etching. Also the etched trenches have the same size (D1=D2). But, since P1 is smaller than P2, the etching has stronger effects on the gate stacks 112b than on the gate stack 112c. In the present embodiment, the etching causes more aluminum reduction in the gate stack 112b than in the gate stack 112c. The different amounts of aluminum reduction cause the work function of the gate electrodes 110 in the two transistors Tr2 and Tr3 to be different, which subsequently cause the threshold voltage of Tr2 to be different from the threshold voltage of Tr3. For example, when both transistors Tr2 and Tr3 are n-type FETs, the greater amount of aluminum reduction in the gate stack 112b than in the gate stack 112c causes the threshold voltage of Tr2 to be greater than the threshold voltage of Tr3. For another example, when both transistors Tr2 and Tr3 are p-type FETs, the greater amount of aluminum reduction in the gate stack 112b than in the gate stack 112c causes the threshold voltage of Tr3 to be greater than the threshold voltage of Tr2. In the present embodiment, the transistors Tr2 and Tr3 are adjacent to each other and the gate stacks 112b and 112c engage the same fin 104. With existing approaches, it is typically very difficult to make the threshold voltages of Tr2 and Tr3 to be meaningfully different. For example, it is typically very difficult to pattern the gate electrodes 110 in the gate stacks 112b and 112c to have different metal layers due to the ever-smaller device sizes and the limited resolution of existing photolithography processes. However, by etching the gate stacks 112b and 112c with different proximities to the fin 104, their threshold voltages can be more easily tuned.

For another example, with everything else being the same, when the size of the etched trench is greater, the etchant exerts stronger effects on the gate electrode 110. This is the scenario for the gate stacks 112b and 112e which have the same width and the same composition in their respective gate electrodes 110 before the etching. Also, the proximities of the etching are the same (P1=P3). But, since D3 is greater than D1, the etching has stronger effects on the gate stack 112e than on the gate stack 112b. For example, it causes more aluminum reduction in the gate stack 112e than in the gate stack 112b. As a result, when both transistors Tr2 and Tr5 are n-type FETs, the different etching effects cause the threshold voltage of Tr5 to be greater than the threshold voltage of Tr2. For another example, when both transistors Tr2 and Tr5 are p-type FETs, the different etching effects cause the threshold voltage of Tr2 to be greater than the threshold voltage of Tr5. Although the transistors Tr2 and Tr5 are interposed by the transistors Tr3 and Tr4 in the present embodiment, they can be adjacent in other embodiments. Hence, different sizes in the etching provide another way of tuning transistor threshold voltages for adjacent transistors or transistors within a small vicinity.

For yet another example, with everything else being the same, when the width of the etched gate stack 112 is greater, the etchant exerts stronger effects on the respective gate electrode 110. This is the scenario for the gate stacks 112a and 112b which have the same composition in their respective gate electrode 110 before the etching. Also, the etching proximities are the same (both are P1), and the sizes of the etched trenches are the same (both are D1). But, since the gate stack 112a is wider than the gate stack 112b (W1>W2), the etching exerts stronger effects on the gate stack 112a than on the gate stack 112b. For example, it causes more aluminum reduction in the gate stack 112a than in the gate stack 112b. As a result, when both transistors Tr1 and Tr2 are n-type FETs, the different etching effects cause the threshold voltage of Tr1 to be greater than the threshold voltage of Tr2. For another example, when both transistors Tr1 and Tr2 are p-type FETs, the different etching effects cause the threshold voltage of Tr2 to be greater than the threshold voltage of Tr1.

In embodiments, the tuning of the threshold voltages of the transistors Tr1-6 by strategically selecting the location and size of the etched trenches (therefore, the location and the size of the dielectric features 114a-c) can be combined with different work function metal layers in the respective gate electrodes 110 to provide even more different threshold voltages, which can be very difficult (if not impossible) to achieve by patterning the work function metal layers alone.

The dielectric layer 114 may include one or more dielectric materials, such as silicon nitride, silicon oxide, silicon oxynitride, fluoride-doped silicate glass (FSG), a low-k dielectric material, and/or other suitable insulating material. Particularly, the portion of the dielectric layer 114 in physical contact with the gate stacks 112 includes a dielectric material that does not react with the metal materials of the gate stack 112. For example, that portion of the dielectric layer 114 includes silicon nitride in an embodiment. The dielectric layer 114 may be deposited using CVD, PVD, ALD, or other suitable methods.

The dielectric layer 116 may include one or more dielectric materials, such as silicon nitride, silicon oxide, silicon oxynitride, fluoride-doped silicate glass (FSG), a low-k dielectric material, and/or other suitable insulating material. The dielectric layer 116 may be deposited using CVD, PVD, or other suitable methods.

Figure 2A:
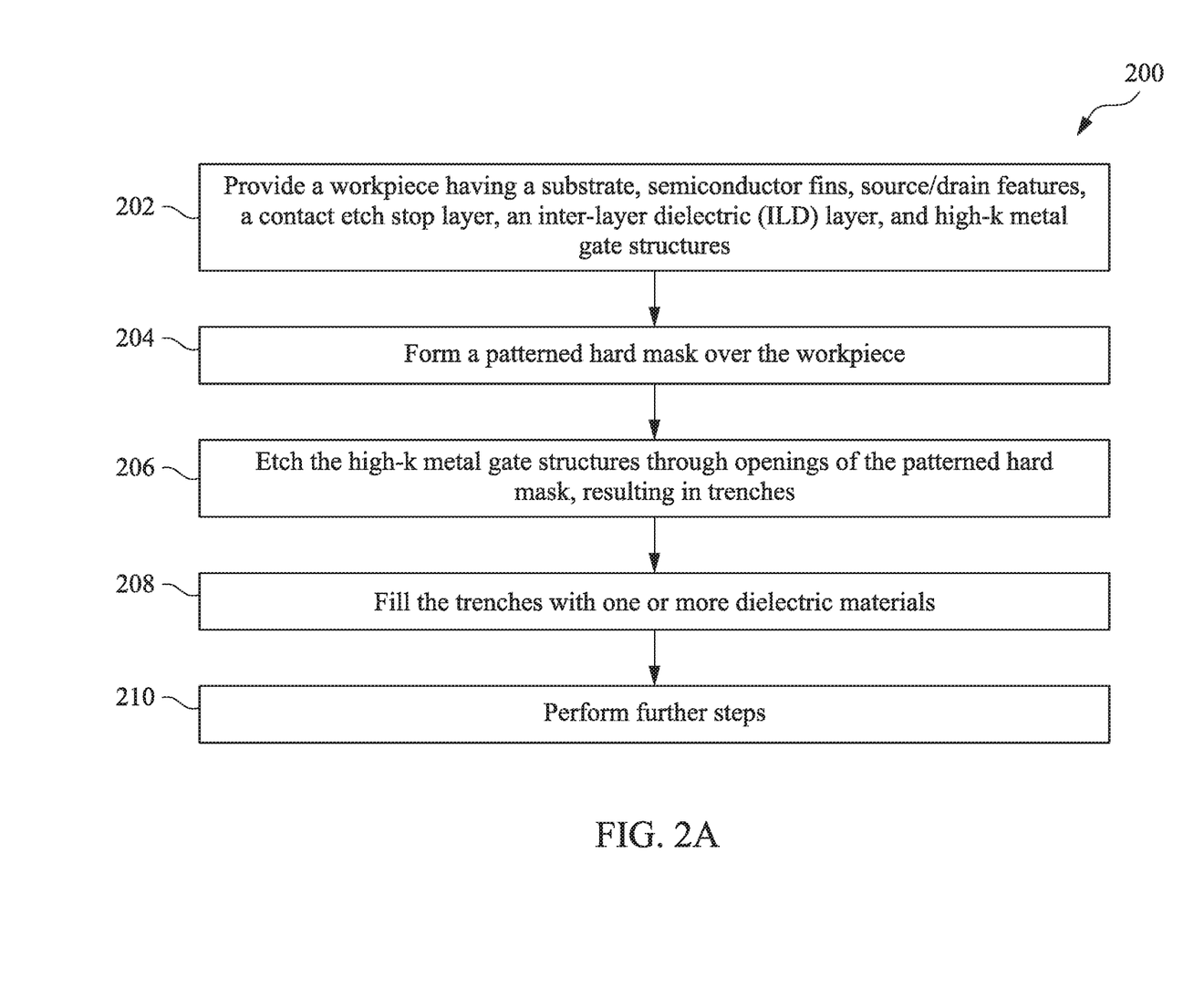
FIG. 2A shows a flow chart of a method for forming the semiconductor structure shown in FIGS. 1A-1B, according to aspects of the present disclosure.

FIG. 2A illustrates a flow chart of a method 200 for forming the semiconductor device 100 in accordance with an embodiment. The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-7, which illustrate various cross-sectional views of the semiconductor device 100 during fabrication steps according to the method 200.

Figure 3:
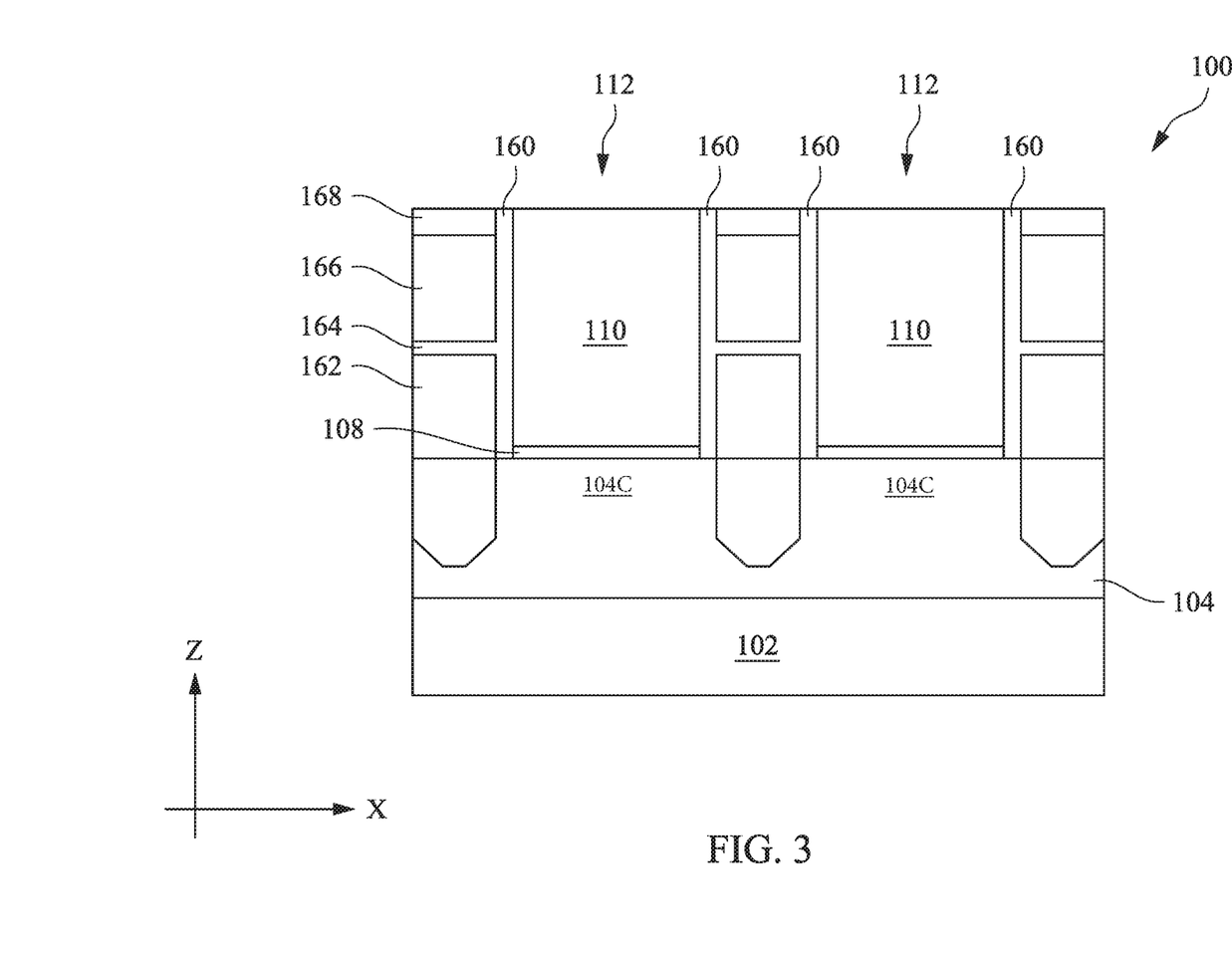
FIGS. 3, 4, 5, 6, and 7 illustrate cross-sectional views of a semiconductor structure during a fabrication process according to the method of FIG. 2A, in accordance with an embodiment.
Figure 4:
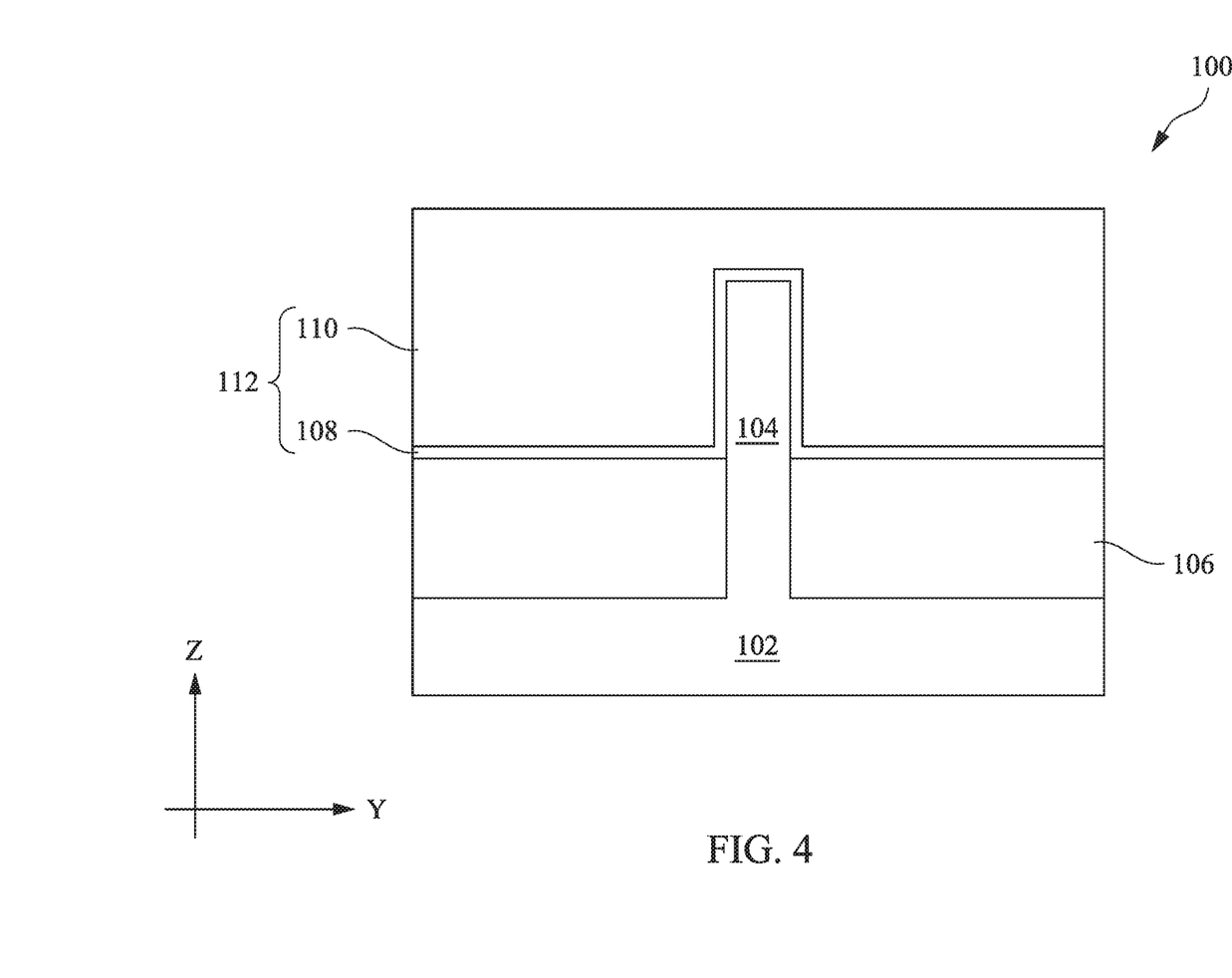

At operation 202, the method 200 (FIG. 2A) provides, or is provided with, a device structure (workpiece) 100, such as shown in FIGS. 3 and 4. FIG. 3 shows a cross-sectional view of the device structure 100 along the C-C line of FIG. 1A, and FIG. 4 shows a cross-sectional view of the device structure 100 along the B-B line of FIG. 1A. At this fabrication stage, the dielectric layer 114 has not been formed, whereas all other features discussed above with reference to FIGS. 1A and 1B have been formed. The device structure 100 includes the substrate 102, the fins 104, the isolation structure 106, and the gate stacks 112. Each gate stack 112 includes the high-k dielectric layer 108 and the gate electrode layer 110. The material and formation of these features have been discussed above. Referring to FIG. 3, the device structure 100 further includes gate spacers 160 on sidewalls of the gate stacks 112, source/drain (S/D) features 162 over the fins 104, a contact etch stop layer (CESL) 164 over the S/D features 162, an interlayer dielectric (ILD) layer 166 over the CESL 164, and a protective dielectric layer 168 over the ILD layer 166. The S/D features 162 sandwich the channel region 104C.

The gate spacers 160 may include a dielectric material, such as silicon oxide, silicon nitride, silicon oxynitride, silicon carbide, other dielectric material, or combinations thereof, and may include one or multiple layers of material. The gate spacers 160 may be formed by deposition (e.g., CVD or PVD) and etching processes.

The S/D features 162 may include n-type doped silicon for NFET devices or p-type doped silicon germanium for PFET devices. The S/D features 162 may be formed by etching recesses into the fins 104 adjacent to the gate spacer 160, and epitaxially growing semiconductor materials in the recesses. The epitaxially grown semiconductor materials may be doped with the proper dopants in-situ or ex-situ. The S/D features 162 may be partially embedded in the fins 104, such as shown in FIG. 3.

The CESL 164 may comprise silicon nitride, silicon oxynitride, silicon nitride with oxygen (O) or carbon (C) elements, and/or other materials; and may be formed by CVD, PVD, ALD, or other suitable methods. The ILD layer 166 may comprise tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 166 may be formed by PECVD, flowable CVD (FCVD), or other suitable methods. The dielectric layer 168 may comprise a nitride such as silicon nitride for protecting the ILD layer 166 during subsequent etching processes.

Figure 5:
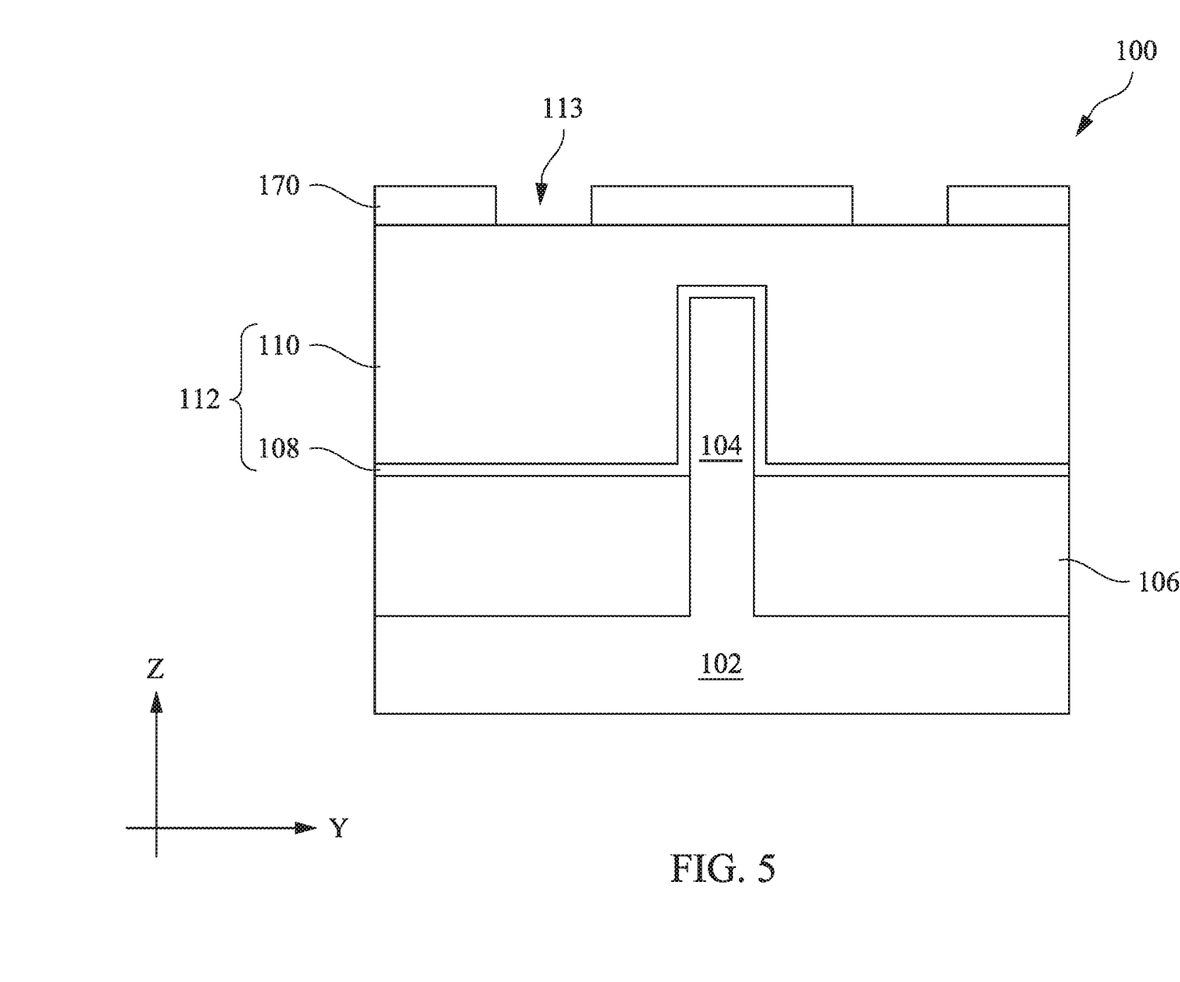

At operation 204, the method 200 (FIG. 2A) forms a hard mask layer 170 over the device 100 and patterns the hard mask layer 170 to provide openings 113, such as shown in FIG. 5 which is a cross-sectional view of the device 100 along the B-B line of FIG. 1A at this fabrication stage. The hard mask layer 170 includes titanium nitride, silicon nitride, amorphous silicon, a combination thereof, or other suitable materials; and may be deposited using CVD, PVD, ALD, or other suitable methods. The openings 113 are directly above portions of the gate stacks 112 and correspond to the shape and size of the dielectric features 114 (e.g., 114a-c) in FIG. 1A. The operation 204 may use photolithography and etching processes to pattern the hard mask layer 170. For example, the operation 204 may form a patterned photoresist over the hard mask layer 170 by photoresist coating, exposing, post-exposure baking, and developing. Then, the operation 204 etches the hard mask layer 170 using the patterned photoresist as an etch mask to form the openings 113. The etching process may include wet etching, dry etching, reactive ion etching, or other suitable etching methods. The patterned photoresist is removed thereafter, for example, by resist stripping.

Figure 2B:
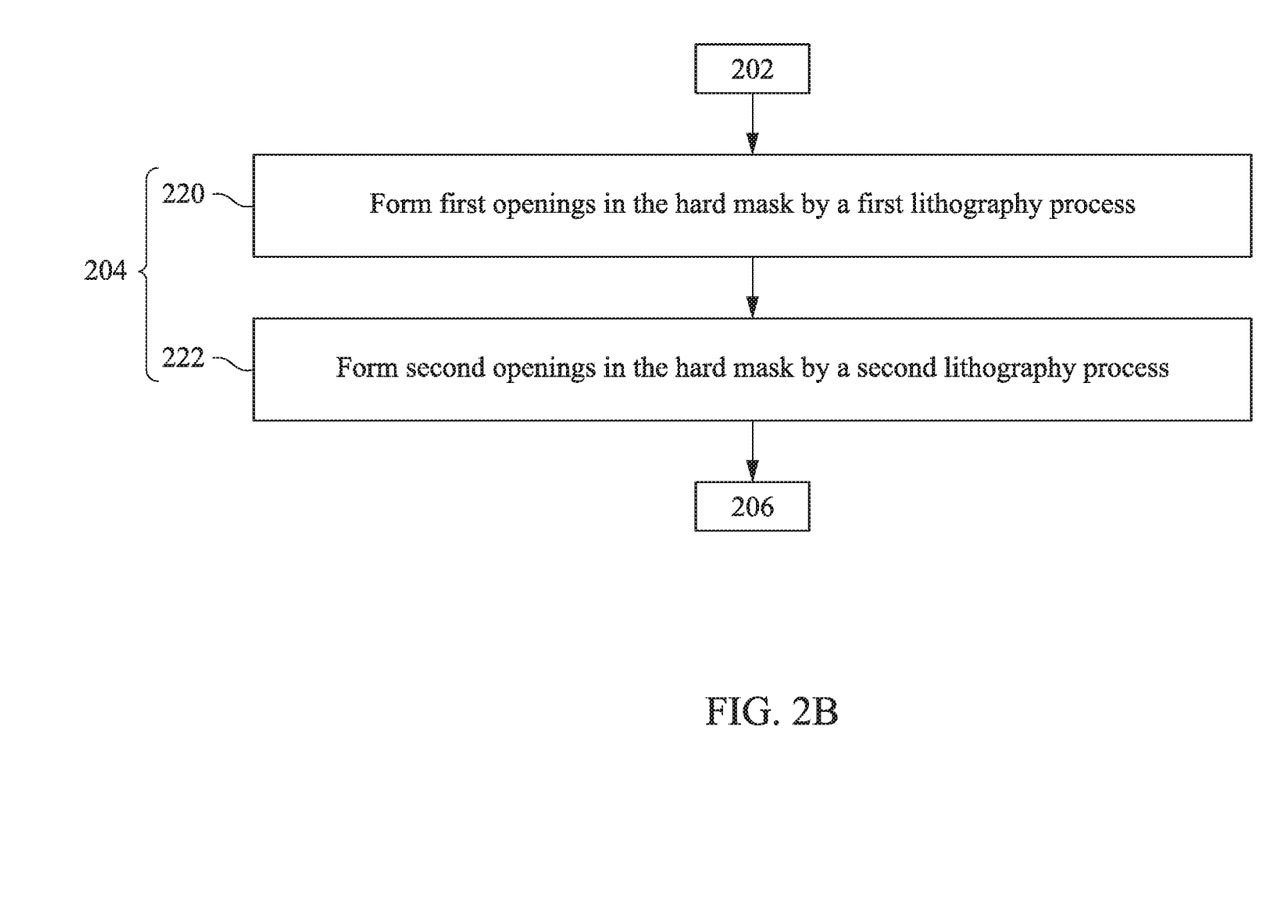
FIG. 2B shows a flow chart of some operations of the method in FIG. 2A, according to aspects of the present disclosure.

In an embodiment, the operation 204 includes a multiple-patterning process, such as a double patterning process, to form the openings 113. For example, the operation 204 may form a subset of the openings 113 by a first photolithography process (operation 220 of FIG. 2B), and form another subset of the openings 113 by a second photolithography process (operation 222 of FIG. 2B). This is beneficial when the patterns for the openings 113 do not fit into one photomask due to photolithography imaging effects. For example, the operation 204 may group the openings 113 that have the same width into one photolithography process. Taking the device 100 in FIG. 1A as example, the operation 204 may form the openings 113 corresponding to the dielectric features 114a and 114b in the same photolithography process since they have the same widths (D1=D2), and form the openings 113 corresponding to the dielectric features 114c in another photolithography process. For another example, the operation 204 may group the openings 113 that have the same proximity to the respective fins 104 into one photolithography process. Taking the device 100 in FIG. 1A as example, the operation 204 may form the openings 113 corresponding to the dielectric features 114a and 114c in the same photolithography process since they have the same proximities to the fins 104 (P1=P3), and form the openings 113 corresponding to the dielectric features 114b in another photolithography process.

Figure 6:
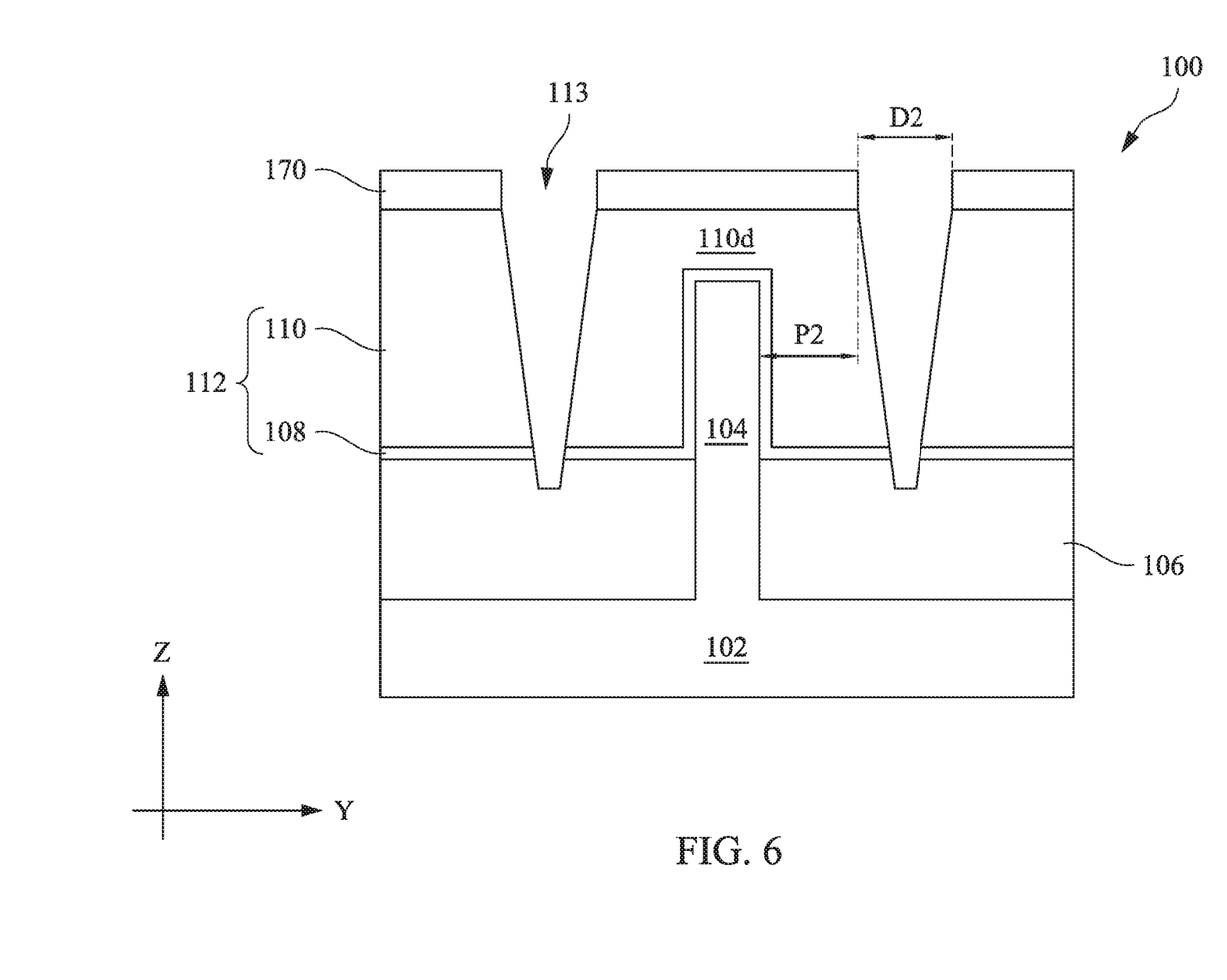

At operation 206, the method 200 (FIG. 2A) etches the high-k metal gate stacks 112 through the openings 113. To ensure that the high-k metal gate stacks 112 are completely etched through, the operation 206 performs over-etching, thereby extending the openings 113 into the isolation structure 106, such as shown in FIG. 6. Since the openings 113 are trenches formed by cutting high-k metal gate stacks, they are also referred to as cut-metal-gate (CMG) trenches. The patterned hard mask layer 170 protects the rest of the high-k metal gate stacks 112 from the etching process.

The operation 206 may use one or more etchants or a mixture of etchants that etch the various layers in the high-k metal gate stacks 112. In an exemplary embodiment, the gate electrode layer 110 includes titanium aluminum nitride (TiAlN), titanium silicon nitride (TiSiN), tantalum nitride (TaN), titanium nitride (TiN), aluminum (Al), tungsten (W), or a combination thereof. To etch such a gate electrode layer 110 and the high-k dielectric layer 108, the operation 206 may apply a dry etching process with an etchant having the atoms of chlorine, fluorine, bromine, oxygen, hydrogen, carbon, or a combination thereof. For example, the etchant may have a gas mixture of $Cl_2$, $O_2$, a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$.

In the present embodiment, the gate electrode layer 110 includes aluminum (e.g., in the form of a compound or alloy containing Al), the operation 206 uses an etchant that contains oxygen, chlorine, or fluorine elements. The etchant not only etches the exposed portions of the gate electrode layer 110 but also reduces the amount of aluminum in the remaining portions thereof such as the gate electrode 110d in FIG. 6, which is part of the gate stack 112d in FIG. 1A. The reduction in aluminum contents causes the work function of the gate electrode 110d to change, which subsequently causes the threshold voltage of Tr4 to change. For example, when the transistor Tr4 is an n-type FET, the aluminum reduction may cause the work function of the gate electrode 110d to increase and the threshold voltage of Tr4 to increase. For another example, when the transistor Tr4 is a p-type FET, the aluminum reduction may cause the work function of the gate electrode 110d to increase and the threshold voltage of Tr4 to decrease. Further, the amount of aluminum reduction caused by the operation 206 is affected by the proximity of the etching to the fins 104 (e.g., the distances P1, P2, and P3), the width of the affected gate stacks 112 (e.g., the widths W1 and W2), and the size of the etched trenches 113 (e.g., the dimensions D1, D2, and D3), as discussed above.

In the present embodiment, the method 200 tunes the threshold voltage of the transistors (e.g., the transistors Tr1-6) by selecting the appropriate materials for the gate electrodes 110, the appropriate etchants for the operation 206, the size and location of the openings 113, and the width of the gate stacks 112.

Figure 7:
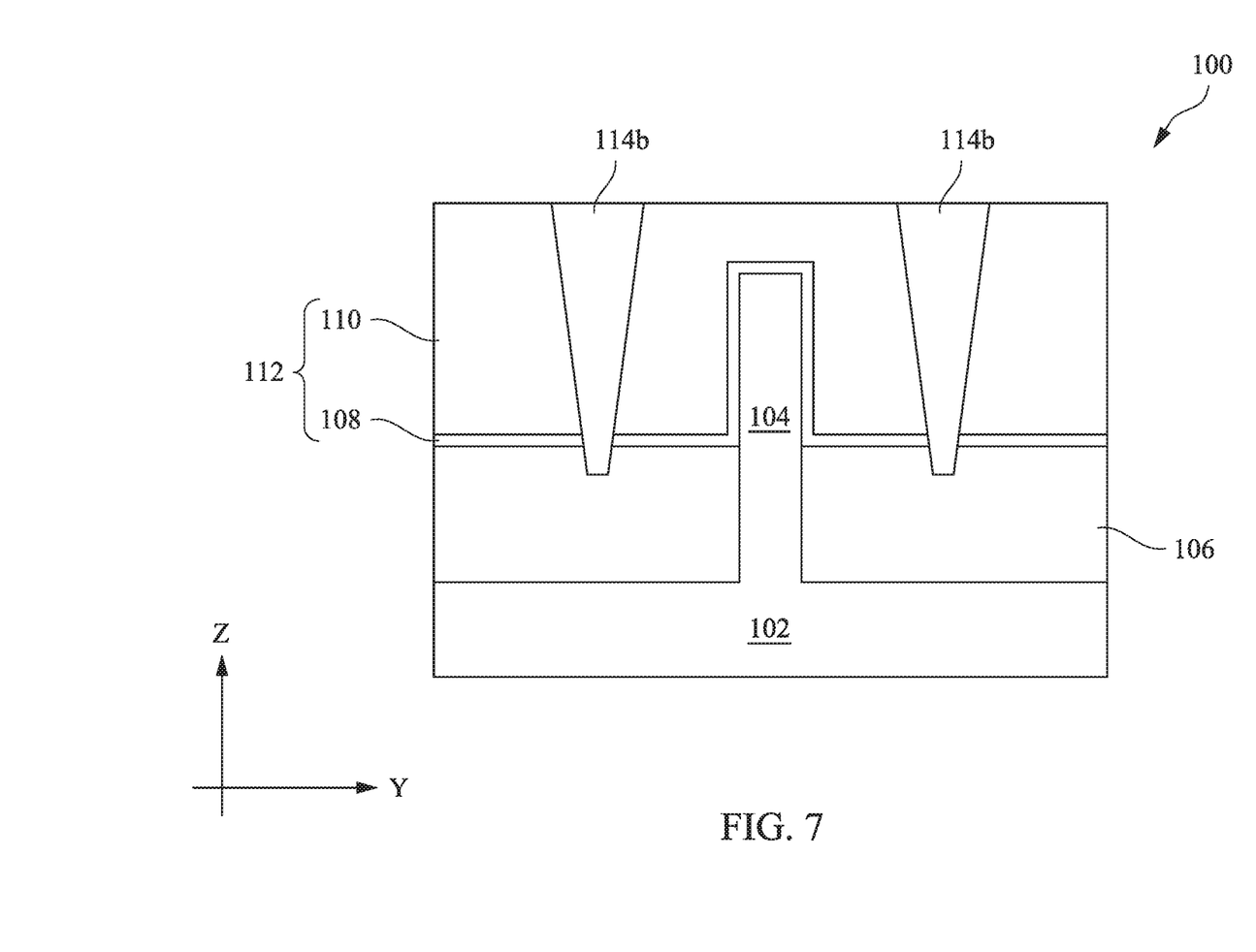

At operation 208, the method 200 (FIG. 2A) fills the CMG trenches 113 with one or more dielectric materials to form the dielectric layer 114, such as shown in FIG. 7. Since the sidewalls of the CMG trenches 113 contain metallic materials, at least the outer portion of the dielectric layer 114 that is in direct contact with the high-k metal gate stacks 112 is free of active chemical components such as oxygen. For example, the outer portion of the dielectric layer 114 may include silicon nitride and is free of oxygen or oxide. The dielectric layer 114 may include some oxide in the inner portion thereof in some embodiments. Alternatively, the dielectric layer 114 may include one uniform layer of silicon nitride and is free of oxide. The dielectric layer 114 may be deposited using CVD, PVD, ALD, or other suitable methods. Subsequently, the operation 208 performs one or more CMP processes to remove the hard mask layer 170 and any excessive dielectric layer 114 outside the CMG trenches 113. Further, the operation 208 may recess the gate electrode layer 110 (as well as the dielectric layer 114) to a desired HK MG height. The resulting structure is shown in FIG. 7.

In an embodiment of the method 200 where the operation 204 includes a multiple patterning process, the operation 206 may include multiple etching processes. For example, the operation 204 may form a first subset of openings 113 in the hard mask layer 170, and the operation 206 then etches a first subset of the gate stacks 112 through the first subset of openings 113 to form a first subset CMG trenches. After the operation 208 fills in the first subset of CMG trenches with the dielectric layer 114, the operation 204 may form a second subset of openings 113 in the hard mask layer 170 (or another hard mask layer), and the above operations 206 and 208 repeat. Various other embodiments of the operations 204, 206, and 208 are contemplated to be within the scope of the present disclosure.

At operation 210, the method 200 (FIG. 2A) performs further steps to complete the fabrication of the device 100. For example, the method 200 may form contacts and vias electrically connecting the S/D features 162 (FIG. 3) and the gate stacks 112 and form metal interconnects connecting various transistors to form a complete IC.

Figure 8:
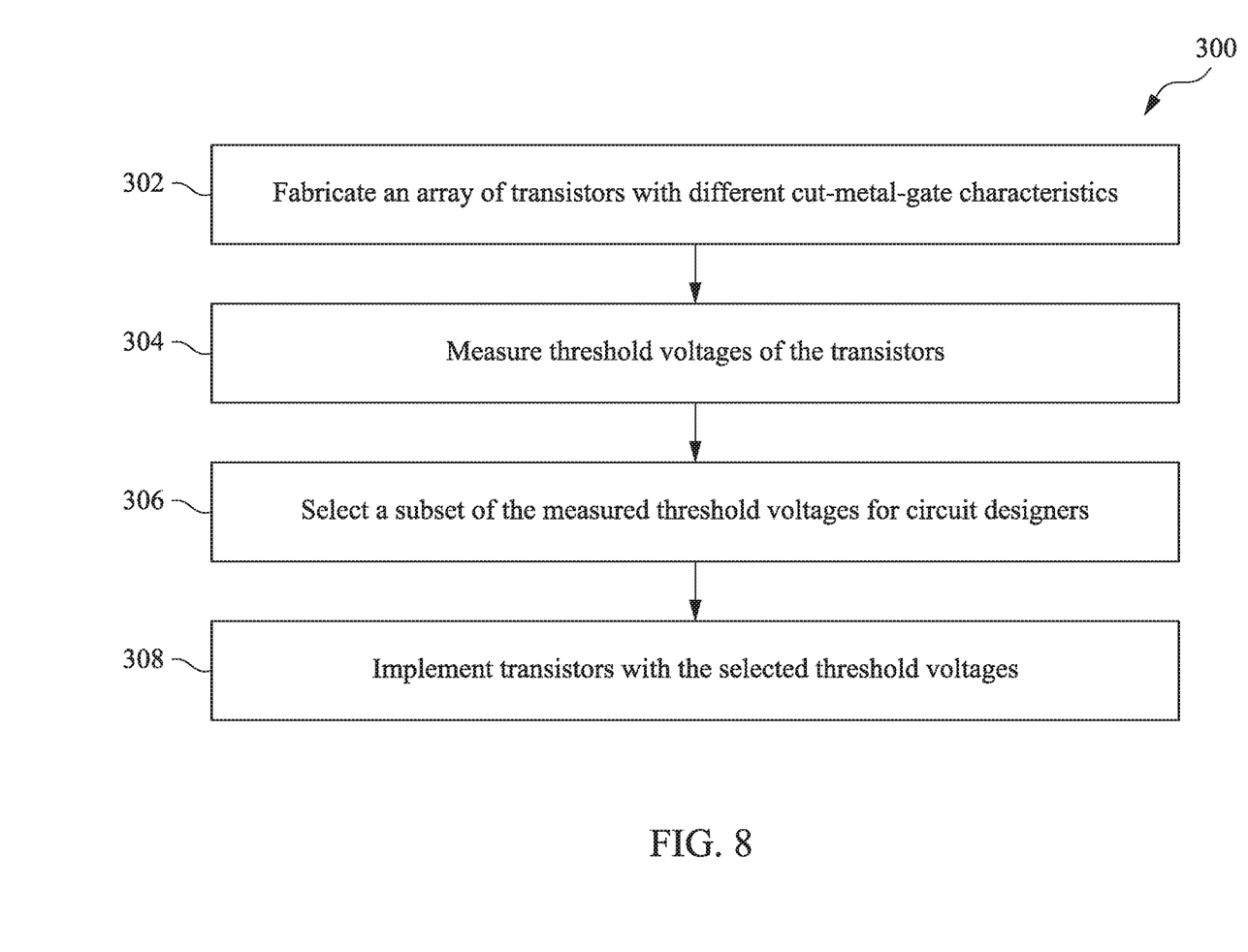
FIG. 8 shows a flow chart of a method for providing transistors with multiple threshold voltages using cut-metal-gate processes, according to aspects of the present disclosure.

FIG. 8 illustrates a flow chart of a method 300 for characterizing transistors with various threshold voltages using cut-metal-gate processes, according to the present disclosure. The method 300 is merely an example, and is not intended to limit the present disclosure beyond what is explicitly recited in the claims. Additional operations can be provided before, during, and after the method 300, and some operations described can be replaced, eliminated, or moved around for additional embodiments of the method. Embodiments of the method 300 may be implemented by semiconductor manufacturers, such as semiconductor foundries, for characterizing cut-metal-gate processes and for providing different transistor threshold voltages to circuit designers or design houses.

At operation 302, the method 300 (FIG. 8) fabricates an array of transistors using cut metal gate processes (e.g., using some embodiments of the method 200). The array of transistors may be formed on test wafer(s) or in testlines (or test keys) on production wafer(s). The array of transistors is formed with different cut-metal-gate characteristics. For example, the array of transistors may include all or a subset of the following combinations of parameters: both n-type and p-type transistors, different configurations in the gate electrodes of the transistors including different materials in the work function metal layers and different widths of the gate electrodes, and different sizes and locations of the CMG trenches.

At operation 304, the method 300 (FIG. 8) measures the threshold voltage of each transistor in the array. The operation 304 may also build correlations between the measured threshold voltages and the above parameters.

At operation 306, the method 300 (FIG. 8) select a subset of the measured threshold voltages for circuit designers or design houses. For example, the subset of the selected threshold voltages may provide meaningful step sizes, and the corresponding CMG parameters may be reasonably easy to integrate into existing manufacturing processes.

At operation 308, the method 300 (FIG. 8) fabricates transistors with the selected threshold voltages using the cut metal gate process whose parameters have been predetermined from the operation 306.

Although not intended to be limiting, one or more embodiments of the present disclosure provide many benefits to a semiconductor device and the formation thereof. For example, embodiments of the present disclosure provide ways for tuning transistor threshold voltages (Vt) using cut metal gate processes. This advantageously increases the number of Vt choices for circuit designers, enabling a more variety of circuits to be implemented. Particularly, embodiments of the present disclosure can produce adjacent transistors with different threshold voltages, which might be very difficult to implement using existing approaches.

In one exemplary aspect, the present disclosure is directed to a semiconductor device. The semiconductor device includes a first transistor including a first high-k metal gate disposed over a first channel region, the first high-k metal gate having a first width, the first transistor having a first threshold voltage. The semiconductor device further includes a first dielectric feature in physical contact with an end of the first high-k metal gate, defining a first distance from the first channel region to the first dielectric feature along a lengthwise direction of the first high-k metal gate, the first dielectric feature having a first dimension along the lengthwise direction of the first high-k metal gate. The semiconductor device further includes a second transistor including a second high-k metal gate disposed over a second channel region, the second high-k metal gate having a second width, the second transistor having a second threshold voltage. The semiconductor device further includes a second dielectric feature in physical contact with an end of the second high-k metal gate, defining a second distance from the second channel region to the second dielectric feature along a lengthwise direction of the second high-k metal gate, the second dielectric feature having a second dimension along the lengthwise direction of the second high-k metal gate. The first and second transistors are of a same conductivity type. The first and second high-k metal gates have a same number of material layers. The first threshold voltage is different from the second threshold voltage, and at least one of following is true: the first width is different from the second width, the first distance is different from the second distance, and the first dimension is different from the second dimension.

In an embodiment of the semiconductor device, the first and second transistors are both n-type transistors, the first distance is smaller than the second distance, and the first threshold voltage is higher than the second threshold voltage. In another embodiment of the semiconductor device, the first and second transistors are both n-type transistors, the first dimension is greater than the second dimension, and the first threshold voltage is higher than the second threshold voltage. In yet another embodiment of the semiconductor device, the first and second transistors are both n-type transistors, the first width is greater than the second width, and the first threshold voltage is higher than the second threshold voltage.

In an embodiment of the semiconductor device, the first and second transistors are both p-type transistors, the first distance is smaller than the second distance, and the first threshold voltage is lower than the second threshold voltage. In another embodiment of the semiconductor device, the first and second transistors are both p-type transistors, the first dimension is greater than the second dimension, and the first threshold voltage is lower than the second threshold voltage. In yet another embodiment of the semiconductor device, the first and second transistors are both p-type transistors, the first width is greater than the second width, and the first threshold voltage is lower than the second threshold voltage.

In an embodiment of the semiconductor device, the first and second channel regions are disposed in a same semiconductor fin. In another embodiment, both the first and the second high-k metal gates include aluminum.

In another exemplary aspect, the present disclosure is directed to a method. The method includes providing a workpiece that includes a substrate, semiconductor fins over the substrate, first and second high-k metal gate structures engaging the semiconductor fins to define first and second transistors respectively, and a first dielectric layer isolating the semiconductor fins and isolating the first and second high-k metal gate structures, wherein the first and second high-k metal gate structures have a same number of material layers. The method further includes etching the first and second high-k metal gate structures, resulting in a first trench and a second trench in the workpiece, wherein the first trench has a first dimension along a lengthwise direction of the first high-k metal gate structure, and is away from a channel of the first transistor by a first distance, wherein the second trench has a second dimension along a lengthwise direction of the second high-k metal gate structure, and is away from a channel of the second transistor by a second distance. The method further includes filling the first and second trenches with one or more dielectric materials, wherein the first dimension is configured to be different from the second dimension or the first distance is configured to be different from the second distance such that the first and second transistors are provided with different threshold voltages.

In an embodiment, before the etching, the method further includes forming a patterned hard mask over the workpiece, the patterned hard mask providing a first opening corresponding to the first trench and a second opening corresponding to the second trench. In an embodiment of the method, the first and second high-k metal gate structures are etched in separate etching processes. In another embodiment of the method, the first and second high-k metal gate structures engage a same semiconductor fin.

In an embodiment of the method, the first and second high-k metal gate structures have a substantially same width. In another embodiment, the etching uses an etchant that contains oxygen, chlorine, or fluorine elements. In a further embodiment, each of the first and second high-k metal gate structures includes aluminum.

In yet another exemplary aspect, the present disclosure is directed to a method. The method includes providing a workpiece that includes a substrate, semiconductor fins over the substrate, first and second high-k metal gate structures engaging the semiconductor fins and oriented lengthwise along a first direction, wherein the first and second high-k metal gate structures have a same number of material layers and have a substantially same width. The method further includes forming a patterned hard mask over the workpiece, the patterned hard mask providing first and second openings directly over the first and second high-k metal gate structures respectively, wherein the first opening has a first dimension along the first direction and is away from the semiconductor fin by a first distance along the first direction, wherein the second opening has a second dimension along the first direction and is away from the semiconductor fin by a second distance along the first direction, and wherein either the first and second dimensions are different or the first and second distances are different. The method further includes etching the first and second high-k metal gate structures through the patterned hard mask using an etchant that contains oxygen, chlorine, or fluorine elements, resulting in trenches in the workpiece; and filling the trenches with one or more dielectric materials.

In an embodiment of the method, each of the first and second high-k metal gate structures includes aluminum. In another embodiment, the first and second openings are formed in separate photolithography processes. In yet another embodiment, the first dimension is greater than the second dimension, or the first distance is smaller than the second distance.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first transistor including a first metal gate disposed over a first channel region, the first metal gate having a first width, the first transistor having a first threshold voltage;
   a first dielectric feature in physical contact with an end of the first metal gate, defining a first distance from the first channel region to the first dielectric feature along a lengthwise direction of the first metal gate, the first dielectric feature having a first dimension along the lengthwise direction of the first metal gate;
   a second transistor including a second metal gate disposed over a second channel region, the second metal gate having a second width, the second transistor having a second threshold voltage; and
   a second dielectric feature in physical contact with an end of the second metal gate, defining a second distance from the second channel region to the second dielectric feature along a lengthwise direction of the second metal gate, the second dielectric feature having a second dimension along the lengthwise direction of the second metal gate,
   wherein the first and second transistors are of a same conductivity type, the first and second metal gates have a same number of material layers, the first threshold voltage is different from the second threshold voltage, and at least one of following is true: the first width is different from the second width, the first distance is different from the second distance, and the first dimension is different from the second dimension.

2. The semiconductor device of claim 1, wherein the first and second transistors are both n-type transistors, the first distance is smaller than the second distance, and the first threshold voltage is higher than the second threshold voltage.

3. The semiconductor device of claim 1, wherein the first and second transistors are both n-type transistors, the first dimension is greater than the second dimension, and the first threshold voltage is higher than the second threshold voltage.

4. The semiconductor device of claim 1, wherein the first and second transistors are both n-type transistors, the first width is greater than the second width, and the first threshold voltage is higher than the second threshold voltage.

5. The semiconductor device of claim 1, wherein the first and second transistors are both p-type transistors, the first distance is smaller than the second distance, and the first threshold voltage is lower than the second threshold voltage.

6. The semiconductor device of claim 1, wherein the first and second transistors are both p-type transistors, the first dimension is greater than the second dimension, and the first threshold voltage is lower than the second threshold voltage.

7. The semiconductor device of claim 1, wherein the first and second transistors are both p-type transistors, the first width is greater than the second width, and the first threshold voltage is lower than the second threshold voltage.

8. The semiconductor device of claim 1, wherein the first and second channel regions are disposed in a same semiconductor fin.

9. The semiconductor device of claim 1, wherein both the first and the second metal gates include aluminum.

10. A semiconductor device, comprising:
    a first transistor including a first metal gate disposed over a first channel region, the first metal gate having a first width, the first transistor having a first threshold voltage;
    a second transistor including a second metal gate disposed over a second channel region, the second metal gate having a second width, the second transistor having a second threshold voltage; and a first dielectric feature, a second dielectric feature, a third dielectric feature, and a fourth dielectric feature, wherein the first dielectric feature is in contact with an end of the first metal gate and the second dielectric feature is in contact with the other end of the first metal gate, wherein the third dielectric feature is contact with an end of the second metal gate and the fourth dielectric feature is contact with the other end of the second metal gate, wherein a first distance between the first and second dielectric features is different from a second distance between the third and fourth dielectric features.

11. The semiconductor device of claim 10, wherein the first and second transistors are both n-type transistors, the first distance is smaller than the second distance, and the first threshold voltage is higher than the second threshold voltage.

12. The semiconductor device of claim 10, wherein the first and second transistors are both n-type transistors, the first width is greater than the second width, and the first threshold voltage is higher than the second threshold voltage.

13. The semiconductor device of claim 10, wherein the first and second transistors are both p-type transistors, the first distance is smaller than the second distance, and the first threshold voltage is lower than the second threshold voltage.

14. The semiconductor device of claim 10, wherein the first and second transistors are both p-type transistors, the first width is greater than the second width, and the first threshold voltage is lower than the second threshold voltage.

15. The semiconductor device of claim 10, wherein both the first and the second metal gates include aluminum.

16. A semiconductor device, comprising:
a first transistor including a first metal gate disposed over a first channel region, the first metal gate having a first width, the first transistor having a first threshold voltage;
a first dielectric feature in physical contact with an end of the first metal gate, defining a first distance from the first channel region to the first dielectric feature along a lengthwise direction of the first metal gate, the first dielectric feature having a first dimension along the lengthwise direction of the first metal gate, the first metal gate comprising aluminum;
a second transistor including a second metal gate disposed over a second channel region, the second metal gate having a second width, the second transistor having a second threshold voltage; and
a second dielectric feature in physical contact with an end of the second metal gate, defining a second distance from the second channel region to the second dielectric feature along a lengthwise direction of the second metal gate, the second dielectric feature having a second dimension along the lengthwise direction of the second metal gate, the second metal gate comprising aluminum,
wherein the first and second transistors are of a same conductivity type, the first and second metal gates have a same number of material layers, the first threshold voltage is different from the second threshold voltage, and at least one of following is true: the first width is different from the second width, the first distance is different from the second distance, and the first dimension is different from the second dimension.

17. The semiconductor device of claim 16, wherein the first and second transistors are both n-type transistors, the first distance is smaller than the second distance, the first threshold voltage is higher than the second threshold voltage, and an aluminum content of the first metal gate is smaller than an aluminum content of the second metal gate.

18. The semiconductor device of claim 16, wherein the first and second transistors are both n-type transistors, the first dimension is greater than the second dimension, and the first threshold voltage is higher than the second threshold voltage, and an aluminum content of the first metal gate is smaller than an aluminum content of the second metal gate.

19. The semiconductor device of claim 16, wherein the first and second transistors are both n-type transistors, the first width is greater than the second width, and the first threshold voltage is higher than the second threshold voltage, and an aluminum content of the first metal gate is smaller than an aluminum content of the second metal gate.

20. The semiconductor device of claim 16, wherein the first and second transistors are both p-type transistors, the first distance is smaller than the second distance, and the first threshold voltage is lower than the second threshold voltage.

* * * * *